United States Patent [19]
Lee et al.

[11] Patent Number: 5,748,543
[45] Date of Patent: May 5, 1998

[54] SELF REPAIRING INTEGRATED CIRCUIT MEMORY DEVICES AND METHODS

[75] Inventors: Sang-Bo Lee, Kyungki-do; Soo-In Cho, Seoul, both of Rep. of Korea

[73] Assignee: Samsung Electronics Co., Ltd., Suwon, Rep. of Korea

[21] Appl. No.: 705,556

[22] Filed: Aug. 29, 1996

[30]  Foreign Application Priority Data

Aug. 31, 1995 [KR] Rep. of Korea ............... 284131/1995

[51] Int. Cl.$^6$ ............................................. G11C 7/00
[52] U.S. Cl. .................... 365/200; 365/201; 365/225.7; 365/230.03
[58] Field of Search ........................ 365/200, 225.7, 365/230.03, 201

[56]  References Cited

U.S. PATENT DOCUMENTS

| | | | |
|---|---|---|---|
| 4,473,895 | 9/1984 | Tatematsu | 365/200 |
| 4,829,480 | 5/1989 | Seo | 365/200 |
| 5,502,676 | 3/1996 | Pelley, III et al. | 365/200 |
| 5,544,106 | 8/1996 | Koike | 365/200 |
| 5,566,107 | 10/1996 | Gilliam | 365/200 |
| 5,576,999 | 11/1996 | Kim et al. | 365/200 |
| 5,596,536 | 1/1997 | Koh | 365/200 |

OTHER PUBLICATIONS

Tanabe et al., "A 30-ns 64-Mb DRAM with Built-in Self-Test and Self-Repair Function", IEEE Journal of Solid-state Circuits, vol. 27, No. 11, Nov. 1992, pp. 1525-1533.

Primary Examiner—David C. Nelms
Assistant Examiner—Hien Nguyen
Attorney, Agent, or Firm—Myers Bigel Sibley & Sajovec

[57]  ABSTRACT

Self repairing integrated circuit memory devices include the plurality of normal memory cells, plurality of spare memory cells and a plurality of spare substituting circuits. A spare substituting circuit is responsive to a defective normal memory cell address which is programmed therein, to substitute at least one spare memory cell for at least one defective normal memory cell which is located at the defective normal memory cell address which is programmed therein. A sequential spare substituting circuit selector is connected to the spare substituting circuits and is responsive to a defect indication signal, to sequentially select a respective one of the spare circuits for programming with sequential ones of the defective normal memory cell addresses. An alarm signal is generated if all of the spare substituting circuits have been used. If a defect is present in at least two normal memory cells in different rows and the same column, a spare column is substituted rather than two spare rows. Also, if all rows substituting circuits have been programmed spare column substituting circuits are used. Defective addresses are programmed using electrically programmable fuses preferably polycrystalline silicon elongated fuses.

31 Claims, 15 Drawing Sheets

SELF REPAIRING INTEGRATED CIRCUIT MEMORY DEVICES AND METHODS

FIELD OF THE INVENTION

The present invention relates to integrated circuit memory devices, and more particularly to repair circuits and methods for memory devices, which can repair failed memory cells.

BACKGROUND OF THE INVENTION

With the increasing integration of integrated circuit memory devices, redundancy circuits (or "repair circuits") and methods for replacing defective memory cells by redundant (or "spare") memory cells are increasingly used to reduce the manufacturing cost and increase the manufacturing yields of chips. In order to repair the defective memory cells (or defective bit cells) by the spare memory cells, the defective memory cells in the memory cell array are generally detected during a wafer test or during a burn-in test after packaging, as is well-known in the art.

In most memory devices, the spare memory cells are separated from the regular memory cell array. If a failed cell is detected in a regular memory cell array during wafer test or burn-in test, the failed memory cell is separated from the regular memory cell array and then is replaced by a spare memory cell in the spare memory cell array.

In order to replace the failed memory cell by the spare memory cell as described above, memory devices generally include at least one spare row of memory cells, and at least one spare column of memory cells, a row redundancy circuit for activating a spare row of memory cells and a column redundancy circuit for activating a spare column of memory cells. At least one redundancy circuit is generally required in a memory device to replace defective (or failed) memory cells by additional spare memory cells (bit cells), thereby enabling normal operation of the memory device.

In conventional repair of memory devices, a failed bit cell address is detected by a wafer-test, and the word line or column selection line of the detected failed address is disabled. Then, the failed address is fuse-programmed so as to enable a spare word line or a spare column selection line in the spare memory cell array. Such fuse-programming generally selectively cuts off (opens) the fuse associated with the address corresponding to the failed memory cell. Thus, if an input address corresponds to the address which has been programmed by the fuse-cutting, the spare word line or spare column selection line is enabled. Whether a failed memory cell is replaced by a spare word line or by a spare column selection line is determined in advance, based on the state of the spare row memory cell or spare column memory cell. The fuse-cutting is generally performed by a laser.

Unfortunately, in a conventional repair method as described above, the failed address is detected during the wafer test and thereafter the fuse corresponding to the failed address is opened. This generally requires additional time and equipment for fuse-cutting. In addition, since laser fuse cutting is generally difficult after packaging the memory device, a failed memory cell which occurs after packaging or during burn-in cannot be readily repaired.

In order to solve the above problems, built-in self test (BIST) is used to detect a failed memory cell upon power-up of a chip using a test program and a self repair circuit on the chip of the integrated circuit memory device. A built-in self repair (BISR) circuit stores the detected failed bit addresses in an additional memory, e.g. in an SRAM. The memory device compares input addresses with the stored failed addresses. These methods are disclosed in detail in the application by Tahabe et al. entitled "A 30-ns 64-Mb DRAM with Built-in Self-Test and Self-Repair Function," IEEE Journal of Solid State Circuits, VOL. 27, No. 11, Nov. 1992, pp 1525–1531. Unfortunately, BIST and BISR methods generally require a microprogram ROM for the test program on the chip, thus generally requiring additional processing complexity. Additional area for the BIST circuit or BISR circuit is also generally required, resulting in an increase of the size of the chip.

Another redundancy technique is disclosed in U.S. Pat. No. 4,473,895 to Tatematsu entitled "Semiconductor Memory Device" (Sep. 25, 1994). In order to remove a single bit failure after device packaging, while maintaining a general redundancy scheme, SRAM cells are added. The failed bit address is repaired by an electrical fuse cutting after packaging. However, this technique generally requires a wafer test and fuse cutting. Further, the SRAM cell and the busses for the address to be input to the SRAM cell may also cause the chip size to increase. Thus, there continues to be a need for techniques which can repair failed memory bits during packaging and burn-in, while reducing test time, process complexity and chip size.

SUMMARY OF THE INVENTION

It is therefore, an object of the present invention to provide improved self-repairing integrated circuit memory devices and repairing methods.

It is another object of the present invention to provide self-repairing integrated circuit memory devices and methods which allow repair after device packaging.

It is yet another object of the present invention to provide self-repairing circuit integrated memory devices and methods which do not require excessive process complexity and or size penalty to provide self-repairing.

These and other objects are provided, according to the present invention, by self repairing integrated circuit memory devices which include a plurality of normal memory cells, a plurality of spare memory cells and a plurality of spare substituting circuits. Each spare substituting circuit is responsive to a defective normal memory cell address which is programmed therein, to substitute at least one spare memory cell for at least one defective normal memory cell which is located at the defective normal memory cell address which is programmed therein.

Sequential spare substituting circuit selecting means is connected to the plurality of spare substituting circuits, and it is responsive to a defect indication signal, to sequentially select a respective one of the spare circuits for programming with sequential ones of defective normal memory cell addresses. Accordingly, the normal memory cells may be tested external to the memory device by an external tester, and a defect signal may be provided to the memory device when a defective cell is located. The sequential spare substituting circuit selecting means uses the defect signal to sequentially select a spare substituting circuit which is programmed with the defective address for redundancy repair. Accordingly, excessive chip size overhead is not needed by the redundancy repairing circuits.

According to another aspect of the present invention, the sequential spare substituting circuit selecting means also includes means for generating an alarm signal in response to each of the plurality of spare substituting circuits being sequentially selected. Accordingly, if all of the spare substituting circuits have been used, and additional defects are found by the external tester, the memory is flagged as being unrepairable, because not enough spare substituting circuits have been provided.

According to yet another aspect of the present invention, the plurality of normal memory cells are arranged in an array having plurality of normal memory cell rows and a plurality of normal memory cell columns. Similarly, the plurality of spare memory cells are arranged in a plurality of spare memory cell rows and a plurality of spare memory cell columns. The plurality of spare substituting circuits comprise a plurality of row substituting circuits and a plurality of column substituting circuits. Each of the row substituting circuits is responsive to a defective normal memory cell row address which is programmed therein, and which substitutes a spare memory cell row for a normal memory cell row including a defective memory cell which is located at the defective normal memory cell row address which is programmed therein. Each column substituting circuit is responsive to a defective normal memory cell column address which is programmed therein, and which substitutes a spare memory cell column for a normal memory cell column including a defective memory cell which is located at the defective normal memory cell column address which is programmed therein. The sequential spare substituting circuit selecting means sequentially selects a respective one of the row substituting circuits for programming with sequential ones of defective normal memory cell row addresses, and sequentially selects a respective one of the column substituting circuits for programming with sequential ones of the defective normal memory cell column addresses.

According to one aspect of the present invention, the sequential spare substituting circuit selecting means is responsive to a defect indicating signal which indicates a defect in at least two normal memory cells in different rows and the same column, for activating a sequential spare column selecting means for programming with the address of the same column. According to another aspect of the present invention, the sequential spare substituting circuit selecting means includes means, which is responsive to an indication that a last one of the plurality of spare row substituting circuits has been programmed, for sequentially selecting a respective one of the spare column substituting circuits.

Each of the spare substituting circuits preferably comprises a plurality of electrically programmable fuses. Means, responsive to a defective normal memory cell address which is applied to the spare substituting circuit, programs the plurality of electrically programmable fuses with the defective normal memory cell address upon selection of the spare substituting circuit by the sequential spare substituting circuit selecting means. The plurality of electrically programmable fuses preferably comprise a plurality of elongated fuses, such as polycrystalline silicon elongated fuses, each having a central portion and a pair of fuse ends which are wider than the central portion. The programming means preferably comprises current supplying means for applying current through the elongated fuses which correspond to the defective normal memory cell address, to thereby open the elongated fuses which correspond to the defective normal memory cell address. Since the spare substituting circuits are preferably implemented using current programmable fuses, programming may be accomplished after the device has been packaged, without the need for SRAM circuits or other circuits which may exact a size penalty or process complexity penalty.

It will be understood by those having skill in the art that each of the above described aspects of the invention may be used independently to provide improved self-repairing integrated circuit memory devices. Combinations of these aspects may also be used to provide improved self-repairing integrated circuit memory devices. Most preferably, all the aspects are used together to provide self-repairing integrated circuit memory devices which can test and program the memory device after memory device packaging, but which do not incur an undue penalty in terms of device area or fabrication process complexity.

The present invention also includes methods for self-repairing integrated circuit memory devices including a plurality of normal memory cells and a plurality of spare memory cells, using a memory testing system. The normal memory cells are sequentially addressed by the memory testing system and the addressed normal memory cells are sequentially failure tested by the memory testing system. The memory system provides to the memory device a defect indicating signal to indicate that the normal memory cell which is being addressed and failure tested is defective. The memory device performs the step of automatically programming a plurality of fuses in the memory device with the address of the defective normal memory cell in response to the defect indicating signal. At least one spare memory cell is thereby substituted for at least one defective normal memory cell which is located at the defective normal memory cell address.

Thereafter, a second plurality of fuses is selected for programming with a second address of a defective normal memory cell in response to a second defect indicating signal from the memory testing system. At least one second spare memory cell is thereby substituted for at least one second defective memory cell which is located at the second defective normal memory cell address. If the second plurality of fuses is already programmed, an alarm signal is generated.

When spare memory rows and spare memory cell columns are provided, a plurality of fuses in the memory device is automatically programmed with the column address of a defective normal memory cell in response to a defect indicating signal, if all of the spare memory cell rows have been substituted for defective memory cell rows, to thereby substitute a spare memory cell column for a defective normal memory cell column. In another aspect, the fuses in the memory device are automatically programmed with the column address of the defective normal memory cell in response to the defect indicating signal, if at least two different rows of normal memory cells include a defective memory cell in the same column. A spare memory cell column is thereby substituted for at least two different rows of normal memory cells which include a defective memory cell in the same column.

Automatic programming preferably occurs by automatically applying current to selected ones of the plurality of fuses in the memory device, to thereby open the fuses which correspond to the address of the defective normal memory cell in response to the defect indicating signal. At least one spare memory cell is thereby substituted for at least one defective normal memory cell which is located at the defective normal memory cell address.

Accordingly, failed memory cells can be repaired simultaneously with a memory cell test which is performed after device packaging. Spare columns may be used to repair failed row memory cells after all spare rows have been used to repair failed row memory cells. The time which is required for testing and repairing at the wafer stage can be reduced, and the repair operation can be performed simultaneously with burn-in testing which is performed after packaging. One of a plurality of spare circuits is automatically selected in response to a failed address which is detected during a memory test, to thereby automatically program the detected failed address and thereby repair the failed memory cell. Improved self-repairing integrated circuit memory devices and methods are thereby provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
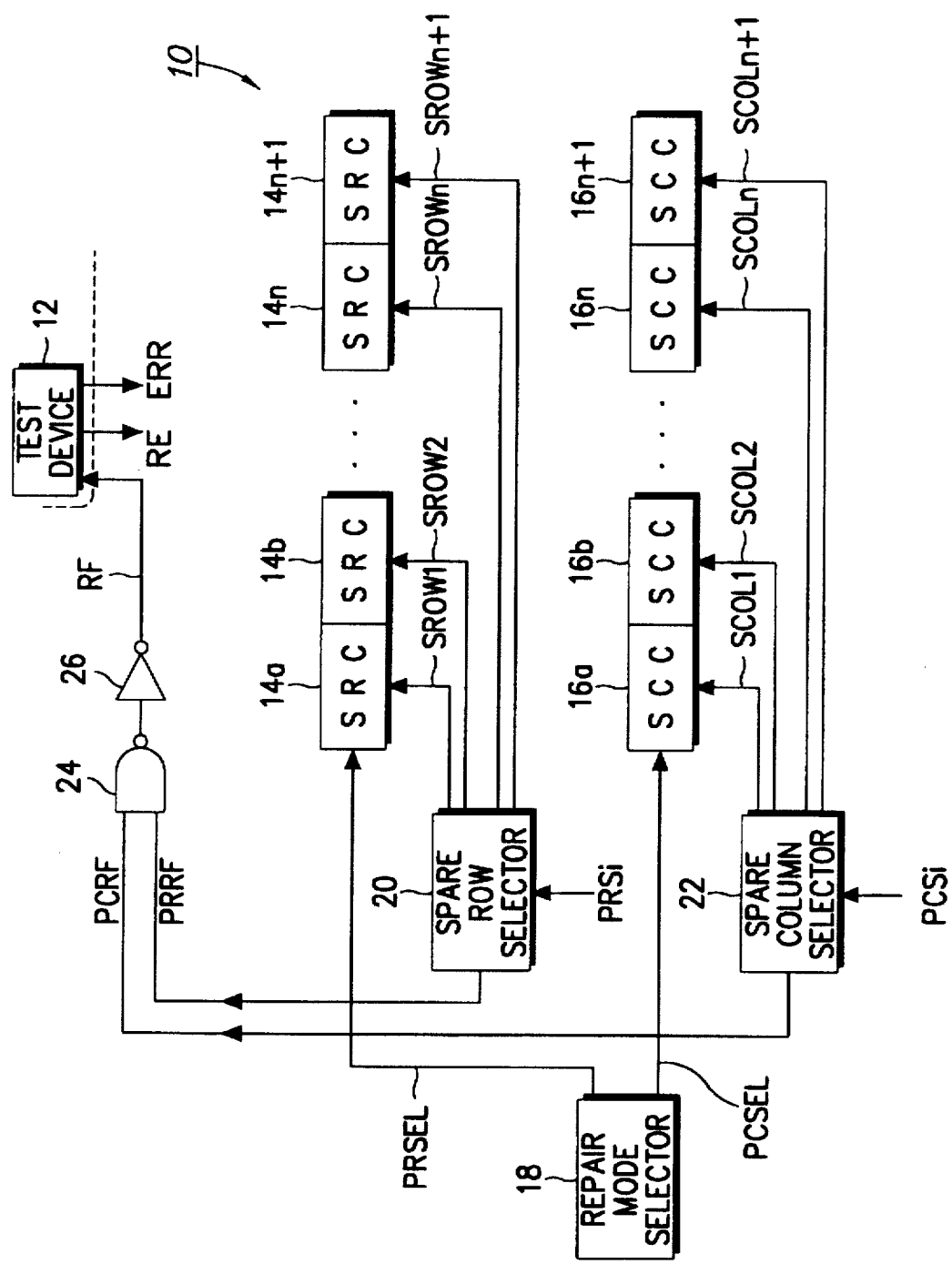
FIG. 1 is a block diagram showing a self repair circuit in an integrated circuit memory device according to the present invention.

FIG. 1 is a block diagram showing a self repairing circuit for an integrated circuit memory device according to the present invention. Referring to FIG. 1, for an interface between a semiconductor memory device 10 and a test device 12 for testing the semiconductor memory device 10, three signal lines are connected therebetween. The signals which are transmitted through these signal lines are a repair enable signal RE and an error pulse ERR which are supplied from the test device 12 to the semiconductor memory device 10, and a repair failure signal RF which is supplied from the semiconductor memory device 10 to the test device 12.

The repair enable signal RE indicates that the repair operation for the failed memory cell is performed simultaneously with the test. If the repair enable signal RE stays at a logic "low" level during the test, only a normal test is performed without the repair operation for the failed memory cell. Thus, in order to repair the failed memory cell, the test should be performed when the repair enable signal RE is at a logic "high" state.

If an error pulse ERR of logic "high" state is generated from the test device 12, the corresponding word line or column selection line of the failed address is replaced by a spare word line or a spare column selection line. The repair failure signal RF is generated as an alarm signal from the semiconductor memory device 10 if all spare word lines and spare column selection lines in the semiconductor memory device 10 have been used for repairs. The repair failure signal RF is applied to the test device 12, thus informing the test device 12 that if the test of all memory cells is not completed before the repair failure signal RF goes to the logic "high" level, repair of the memory device using the available spare memory cells is not possible, because there are too many failed cells. It will be understood that the semiconductor memory device 10 may require additional input/output terminals (pads or pins) on the integrated circuit for inputting/outputting these three signals.

A repair operation will now be described. A repair mode selector 18 in the semiconductor memory device 10 outputs a spare row mode selection signal PRSEL at logic "high" level, thus enabling a plurality of spare row circuits (hereinafter referred to as an "SRC") 14a–14n. The spare row circuit used in the present invention may be a conventional spare row decoder. A spare row selector 20 and a spare column selector 22 output a spare row selection signal SROWi and a spare column selection signal SCOLi, respectively, in response to activation of the initial repair enable signal RE.

When the test device 12 starts the operation of detecting failures of the normal memory cells in the semiconductor memory device 10, the repair enable signal RE is activated to the logic "high" level. This signal is applied to the plurality of spare row circuits SRC 14a–14n, the plurality of spare column circuits (hereinafter referred to as an "SCC") 16a–16n, the repair mode selector 18, the spare row selector 20 and the spare column selector 22.

In this state, if the test device 12 detects a failure of a normal memory cell in the semiconductor memory device 10, the error pulse ERR is activated to the logic "high" level. Only one of the SRC 14a–14n, for example the SRC 14a, which receives the "high" spare row mode selection signal PRSEL from the repair mode selector 18 and the "high" spare row selection signal SROW1 from the spare row selector 20, automatically performs the fuse programming for the failed address corresponding to the failed address signal supplied from the test device 12 by the repair enable signal RE and the error pulse ERR. Thereafter, the SRC 14a supplies a row repair shift clock PRSi (i=1,2, ... i) to the spare row selector 20. Then, the spare row selector 20 activates the spare row selection signal SROW2 which is to be applied to the SRC 14b, in response to the input of the row repair shift clock PRSi.

Thus, when a second failed memory cell is detected, the SRC 14b automatically performs the fuse programming for the detected failed address. If the test device 12 is disabled in the state when the fuse programming for the failed addresses is completed by the above-described operation, the repair enable signal RE is inactivated to the logic "low" level. If the failed address signal is input to the semiconductor memory device 10 which is in an active mode, the spare row word line corresponding to the fail address is activated by the operation of the SRCs 14a–14n and then the memory cell corresponding to the fail address is repaired.

If the test device 12 detects the failed memory cell when the spare row mode selection signal PRSEL output from the repair mode selector 18 is at an inactivate state and the spare column mode selection signal PCSEL is at an activate state, the failed address corresponding to the failed memory cell is automatically programmed at one of the SCCs 16a–16n and then is repaired by a spare column selection line. For example, if the spare column selection signal SCOLL of the SCOLL1–SCOLn output from the spare column selector 22 is activated, the SCC 16a automatically performs the fuse programming for the failed address corresponding to the failed address signal supplied from the test device 12 by the repair enable signal RE and the error pulse ERR. After the fuse programming as described above, the SCC 16a supplies the column repair shift clock PCSi (i=1,2, . . . i) to the spare column selector 22. Then, the spare column selector 22 activates the spare column selection signal SCOL2 which is supplied to the SCC 16b, in response to the column repair shift clock PCSi.

Thus, when a second failed memory cell is detected, the SCC 16b automatically performs the fuse programming for the detected failed address. If the test device 12 is disabled in the state when the fuse programming for the failed addresses is completed by the above-described operation, the repair enable signal RE is inactivated to the logic "low" level. If the failed address signal is input to the semiconductor memory device 10 which is in an active mode, the spare column selection line corresponding to the failed address is activated by the operation of the SCCs 16a–16n and then the memory cell corresponding to the failed address is repaired.

Each of the SRC 14a–14n and SCC 16a–16n has a plurality of electrical fuses, each being opened by a current over a predetermined amount. Each SRC and SCC also has means for fuse-programming the failed address by selectively opening the fuse corresponding to the failed address in response to the input of the failed memory cell detection information and failed address signal.

Figure 2:
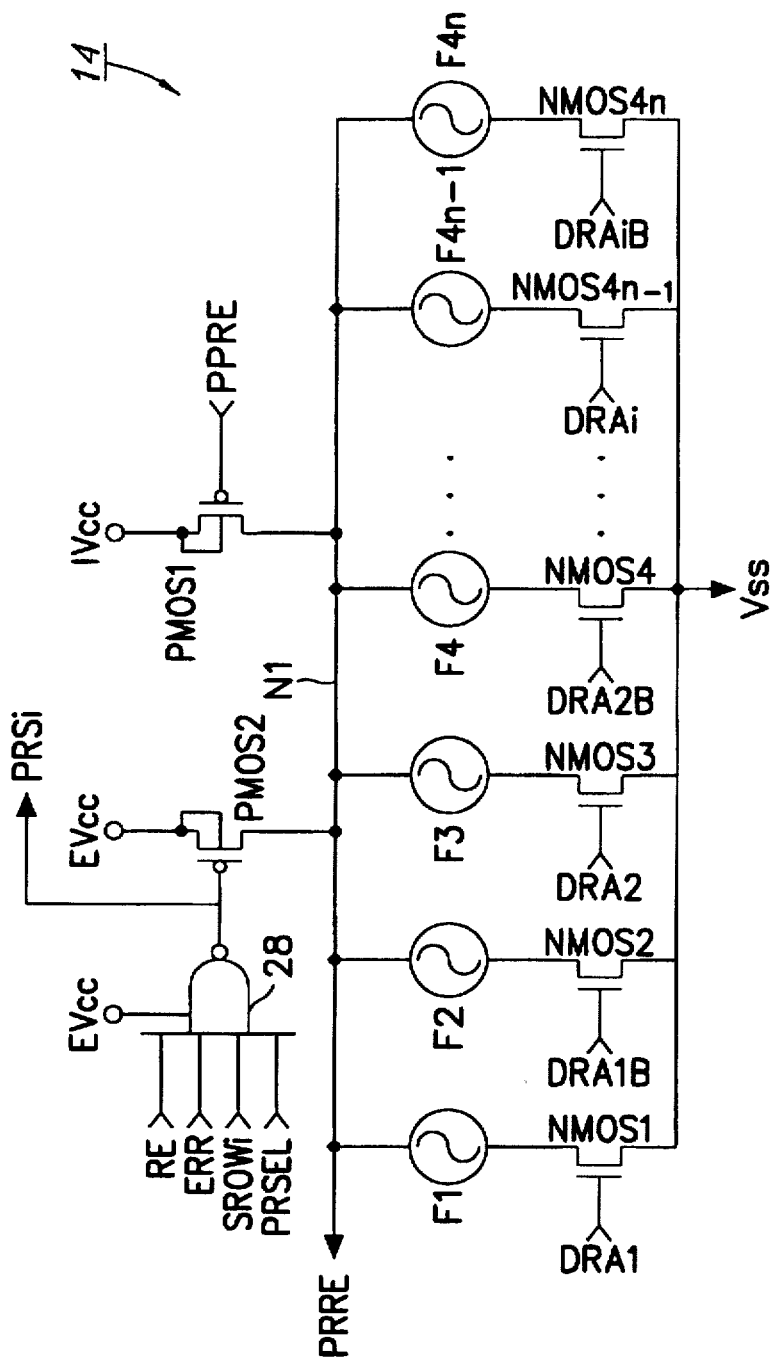
FIG. 2 is a circuit diagram showing a spare row circuit according to the present invention.

FIG. 2 is a circuit diagram showing a spare row circuit 14a–14n according to the present invention, which enables the row repair of the failed memory cell simultaneously with the wafer test by using electrical fuses. Referring to FIG. 2, the spare row circuit comprises a plurality of electrical fuses F1 to F4n commonly connected to an internal node N1 at respective one ends. A plurality of NMOS transistors NMOS1 to NMOS4n have their sources commonly connected to a ground voltage Vss, their drains respectively connected to the other ends of the electrical fuses F1 to F4n, and their gates respectively receiving the decoded row address signals DRA1, DRA1B–DRAi, DRAiB. A first PMOS transistor PMOS1 has a channel connected between the internal node N1 and an internal power supply voltage IVcc, for precharging the internal node N1 to the internal power supply voltage IVcc level in response to the precharge control signal PPRE of logic "low" level.

A program voltage supply unit supplies the program voltage to the internal node N1 which has been precharged to a predetermined voltage level and which is connected to a spare word line, in response to the input of the failed memory cell detection information. The program voltage supplying unit comprises a NAND gate 28 which logically combines the repair enable signal RE, the error pulse ERR, the spare row selection signal SROWi and the spare row mode selection signal PRSEL, and then activates the spare row shift clock PRSi. A second PMOS transistor PMOS2, connected between an external power supply voltage EVCC and the internal node N1, supplies the external power supply voltage EVcc, i.e. the program voltage, to the internal node N1 in response to the spare row shift clock PRSi.

The spare row circuit (or spare row decoder) as described above also includes a plurality of electrical fuses for programming the failed addresses. Each fuse is opened (cut off) by a current over a predetermined amount. The spare row circuit also includes a circuit for cutting off the electrical fuses corresponding to the failed address.

Figure 3:
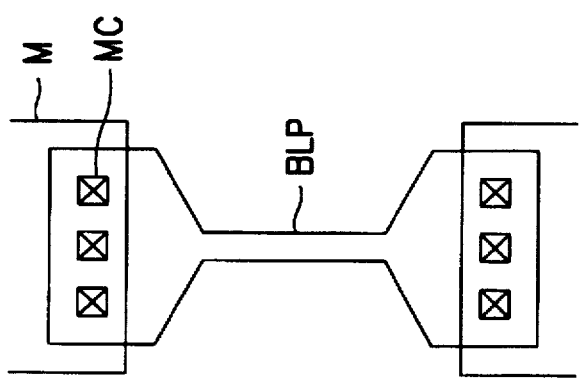
FIG. 3 is a schematic diagram showing a preferred embodiment of an electrical fuse used in the present invention.

FIG. 3 shows one preferred embodiment of an electrical fuse used in the present invention, in which a bottleneck shape of a bit line polycrystalline silicon (poly) BLP is connected between the metals M. Since the voltage by which the fuse is opened a function of the resistance of the bottleneck part of the bit line poly BLP, the resistance value should preferably be determined according to the level of the external power supply voltage EVcc during the memory cell test. In FIG. 3, MC refers to a metal contact.

A process for automatically repairing a failed memory cell simultaneously with a memory cell test will now be described. In order to perform a repair operation during the test, the test device 12 activates the repair enable signal RE to the logic "high" level. If a failed memory cell is detected by the memory cell test, the test device 12 activates the error pulse ERR to the logic "high" level and then supplies it to each block in the semiconductor memory device 10. At this time, the spare row selection signal SROWi output from the spare row selector 20 goes to the logic "high" level. If the failed memory cell is to be repaired by a spare row, the spare row mode selection signal PRSEL output from the repair mode selector 18 is activated to the logic "high" level.

With these operations, the signals RE, ERR, SROWi and PRSEL which are input to the NAND gate 28 of FIG. 2 go to the logic "high" levels. Then, the NAND gate 28, which operates in response to the external power supply voltage EVcc, supplies a logic "low" signal to the gate of the second PMOS transistor PMOS2. The logic "low" signal output from the NAND gate 28 is used as the row repair shift clock PRSi. Therefore, if all control signals which are to be input to the 4-input NAND gate 28 are activated to the logic "high" levels, the second PMOS transistor PMOS2 is turned on, raising the level of the internal node N1 to the external power supply voltage EVcc level.

Only the address signals corresponding to the failed memory cell are input at logic "high" levels, thereby turning on only the NMOS transistors which receive the decoded row address signals corresponding to the failed memory cell at their gates. For example, if the memory cell which is selected when the row addresses RA1–RAi are all at the logic "low" levels is the failed memory cell, only the NMOS transistors NMOS2, NMOS4, . . . NMOS4n which receive at their gates the decoded row addresses DRA1B, DRA2B, . . . DRAiB of logic "high" levels are turned on.

In this state, since the second PMOS transistor PMOS2 is turned on, a current path from the external power supply voltage EVcc to ground voltage Vss is formed via the drain-source channels of the turned-on NMOS transistors. Thereby, the electrical fuses corresponding to the failed address are automatically opened. In this case, in order to isolate the current path from the external power supply voltage EVcc from the internal power supply voltage IVcc, a precharge control signal PPRE of logic "high" level, which is applied to the gate of the first PMOS transistor PMOS1, should be as high as the external power supply voltage EVcc. Thus, when a failed memory cell is detected during the memory cell test by the above operation, the fuses corresponding to the failed address are automatically cut off, thereby programming the failed address.

Once the fuses corresponding to the failed address are automatically opened, and the semiconductor memory device 10 is later in an active state, the repair enable signal RE is input as the logic "low" level. Thus, the output of the NAND gate 28 is inactivated to the logic "high" level, turning off the second PMOS transistor PMOS2. With the transition of the semiconductor memory device 10 to a precharge mode, the first PMOS transistor PMOS1 is turned on, thereby precharging the internal node N1 to the internal power supply voltage IVcc level.

When the memory device is active, after testing has been completed, if the repaired failed address signal and another address signal, e.g. the address signal designating the normal cell bit, are input, the NMOS transistors connected to the fuses which have not been opened are turned on. Then, the internal node N1 goes to the logic "low" level, thus disabling the spare word line driver. That is, the row redundant enable signal PRRE which enables the spare word line driver (not shown) transitions to the logic "low" level, thus not selecting the corresponding spare word line. However, if the failed address signal corresponding to the cut-off fuses, is input, since the fuses corresponding to the input fail address have all been cut off, the internal node N1 is precharged to the logic "high" level by the first PMOS transistor PMOS1. If the internal node N1 maintains the logic "high" level, the row redundant enable signal PRRE goes to the logic "high" level, thus disabling the normal word line connected to the failed memory cell and enabling the corresponding spare word line.

When there are a plurality of spare row circuits 14 as shown in FIG. 1, only one of the spare row circuits should be selected and the fuses within the selected spare row circuit should be opened, for a failed memory cell, thus fuse-programming the failed address. At this time, if the error pulse ERR goes to the logic "high" level, the fuses connected to the drains of the NMOS transistors which receive at their gates the predecoded row addresses corresponding to the fail memory cell are opened, and another spare row circuit is selected before testing the following memory cell. Further, the spare row circuit which has been used in repairing is not selected again until the test is completed. Such a spare row circuit selection is performed by the spare row selector 20 in FIG. 1.

Figure 4:
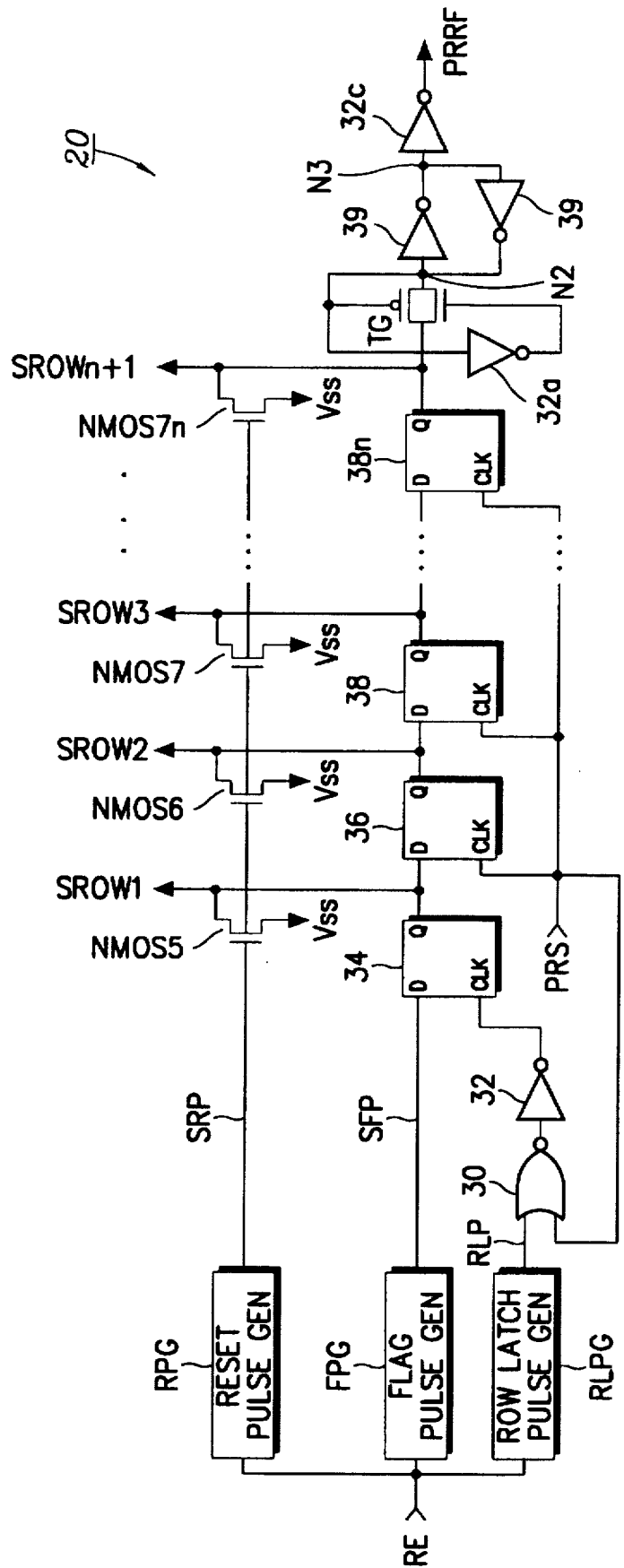
FIG. 4 is a detailed circuit diagram showing a spare row selector of FIG. 1.

FIG. 4 is a detailed circuit diagram showing a spare row selector 20 of FIG. 1, for selecting one of a plurality of spare row circuits. In FIG. 4, N spare row selection signals SROWi, for selecting N spare row circuits, are generated by N stages of shift register comprised of a plurality of series-connected flip-flops 34–38n. Each of the flip-flops 34–38n outputs at its output node the spare row selection signal SROWi which is activated to the logic "high" level. During the course of testing by the test device 12, one of the spare row selection signals SROWi is activated to the logic "high" level, and the spare row circuit which is supplied with the activated spare row selection signal SROWi fuse-programs the failed address, thus performing the spare row repair operation.

Figure 5:
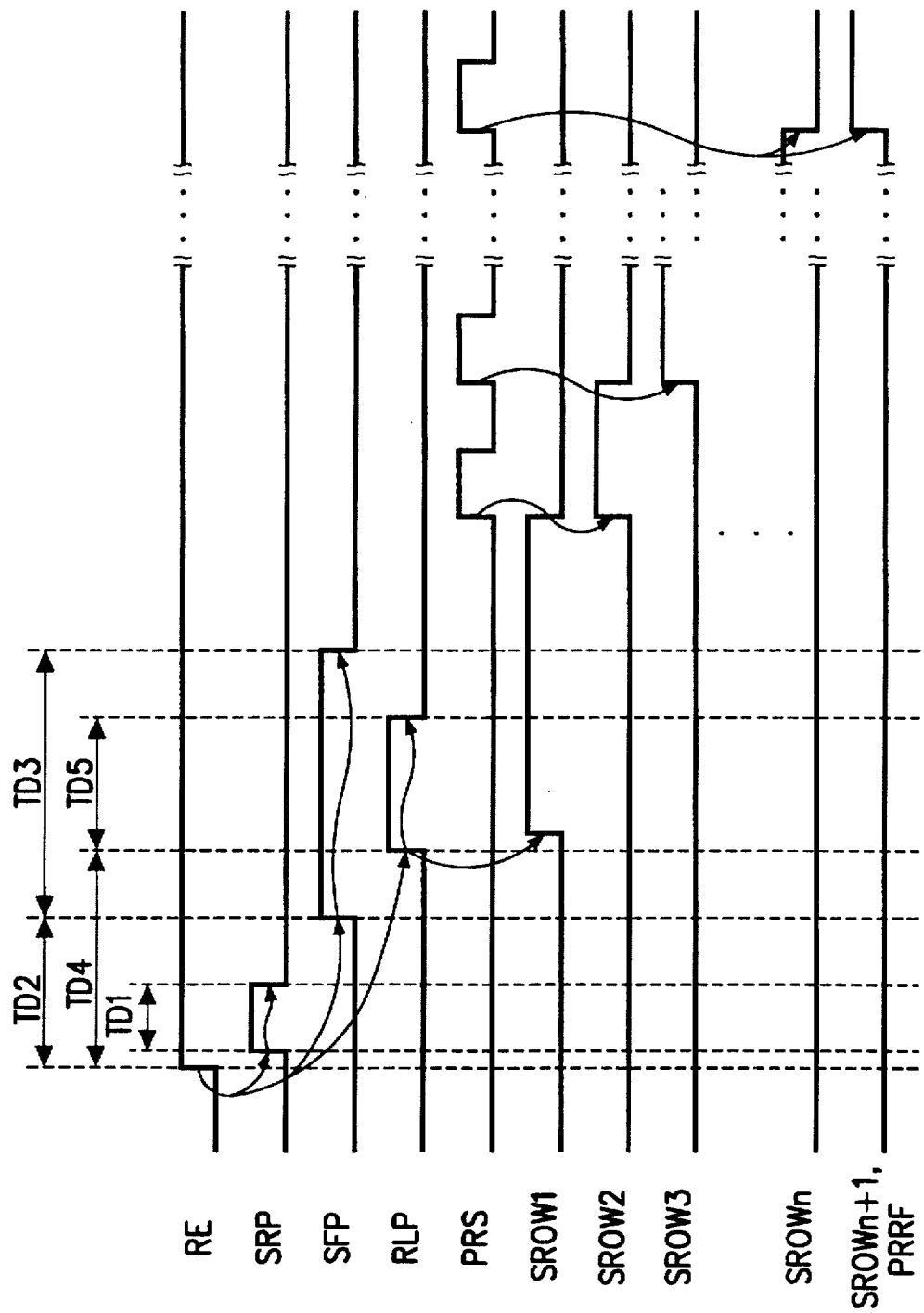
FIG. 5 is a timing diagram showing the operation of FIG. 4.

FIG. 5 is a timing diagram showing the operation of FIG. 4. If the repair enable signal RE output from the test device 12 is activated to the logic "high" level as shown in FIG. 5, it is supplied to the input nodes of a reset pulse generator RPG, a flag pulse generator FPG and a row latch pulse generator RLPG, respectively.

The reset pulse generator RPG generates a high reset pulse SRP as shown in FIG. 5 in response to the high repair enable signal RE and supplies it to the gates of a plurality of NMOS transistors NMOS5–NMOS7n. Each source of the NMOS transistors NMOS5–NMOS7n is connected to the ground voltage Vss. Each drain thereof is connected to the corresponding line between each output node of the flip-flops 34–38n and each input node of the spare row circuits 14a–14n. Thus, if the high reset pulse SRP as shown in FIG. 5 is generated from the reset pulse generator RPG, a plurality of NMOS transistors NMOS5–NMOS7n are turned on, thereby resetting the outputs of the flip-flops 34–38n at the logic "low" levels. That is, all spare row selection signals SROWi go to the logic "low" levels, and thus none of the spare row circuits is selected.

The flag pulse generator FPG generates the high flag pulse SFP as shown in FIG. 5, in response to the high repair enable signal RE. The flag pulse SFP is supplied to the delay terminal D of the first flip-flop 34 as logic "high" information, and is shifted to the right one by one every time the row repair shift clock pulse PRSi is generated, thereby activating one of the spare row selection signals SROWi to the logic "high" level.

The row latch pulse generator RLPG generates the high row latch pulse RLP as shown in FIG. 5, in response to the high repair enable signal RE. These three pulses are generated from the rising edge of the repair enable signal RE. The delay or width of the pulses will be more fully discussed with reference to FIGS. 7–10.

Referring again to FIG. 4, the row latch pulse RLP generated from the row latch pulse generator RLPG as shown in FIG. 5 is provided to one input node of a NOR gate 30. The other input node thereof is connected to the row repair shift clock PRS, and the output node thereof is connected to the clock terminal CLK of the first flip-flop 34 via an invertor 32. Therefore, when the test device 12 initially activates the repair enable signal RE to the logic "high" level as shown in FIG. 5, the first flip-flop 34 of the shift register latches the flag pulse SFP by the row latch pulse RLP, thus activating the spare row selection signal SROWi to the logic "high" level.

The spare row circuit 14a operates in response to the spare row selection signal SROW1 and thereby outputs the row repair shift clock PRSi. At this time, the row repair shift clock PRSi output from the spare row circuit 14a refers to the row repair shift clock PRS1 and is activated to the logic "low" level. In response to the row repair shift clock PRS1, the flag pulse SFP output from the flip-flop 34 is shifted to the flip-flop 36. Such a shift operation is repeated every activation of the row repair shift clock PRS. Thus, a plurality of spare row selection signals SROW1–SROWn are generated by shifting the flag pulse SFP, in response to the row repair shift clock PRS informing that the spare row repair has been performed. If the output of the final flip-flop 38n of the shift register transitions to the logic "high" level by the shift clock of the spare row selection signal SROWi, the latch circuit connected to the output node of the final flip-flop 38n generates the high row repair failure signal PRRF.

In the latch circuit, a transfer gate TG is connected between the final flip-flop 38n and an internal node N2. The signal at the internal node N2 is supplied both to the gate of a PMOS transistor of the transfer gate TG and to the gate of an NMOS transistor thereof via an invertor 32a. Thus, the transfer gate TG can supply the output of the flip-flop 38n to the internal node N2. In addition, the internal node N2 is connected to a latch 39 composed of two inverters, and an output node N3 of the latch 39 is connected to an invertor 32c. Hence, if the output of the flip-flop 38n goes to the logic "high" level, the row repair failure signal PRRF goes to the logic "high" level, thus indicating that all spare row circuits 14a–14n have been selected and repaired. If the row repair failure signal PRRF goes to the logic "high" level, this means that another failed memory cell cannot be repaired by the spare rows.

At this time, the logic "low" signal output from the node N3 is latched by two inverters 39, and thereby the "high" row repair failure signal PRRF maintains the latch state. Therefore, all spare row selection signals SROWi go to the logic "low" levels, allowing no more spare row repair. Accordingly, the spare row selector 20 of FIG. 4 can sequentially select the spare row circuits 14a–14n and automatically program and repair the failed addresses.

Figure 6:
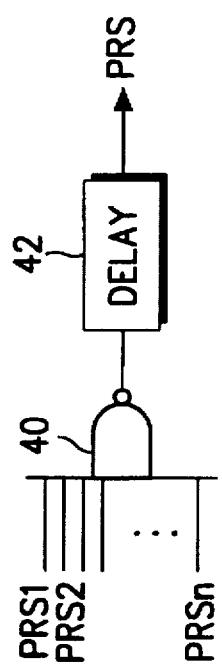
FIG. 6 is a detailed circuit diagram showing a shift clock generator of FIG. 4.

FIG. 6 is a detailed circuit diagram showing the shift clock generator of FIG. 4. It includes a NAND gate 40 which NANDs the row repair shift clocks PRSi (i=1,2,... n) output from the spare row circuits 14a14n, and a delay circuit 42 for delaying the output of the NAND gate 40. If the output of the NAND gate 28 in any one spare row circuit is at the logic "low" level, the row repair shift clock can be supplied to the shift register of FIG. 4.

Figure 7:
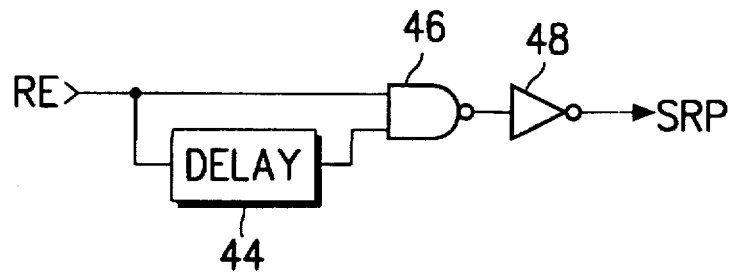
FIG. 7 is a detailed circuit diagram showing a reset pulse generator according to the present invention.

FIG. 7 is a detailed circuit diagram showing a reset pulse generator RPG according to the present invention. This circuit is composed of a delay circuit 44 for delaying the high repair enable signal RE, a NAND gate 46 for NANDing the output of the delay circuit 44 and the repair enable signal RE, and an invertor 48 connected to the output of the NAND gate 46. If the high repair enable signal RE is input to the reset pulse generator RPG, the NAND gate 44 supplies the logic "low" signal to the invertor 48 for a delay time TD1 of the delay circuit 44. If the activation state of the repair enable signal RE is maintained over the delay time TD1, the NAND gate 46 outputs the logic "high" signal, and thereby the reset pulse SRP as shown in FIG. 5 is generated. The delay time TD1 of the reset pulse SRP should be set such that the NMOS transistors NMOS5–NMOS7n can be sufficiently turned on.

Figure 8:
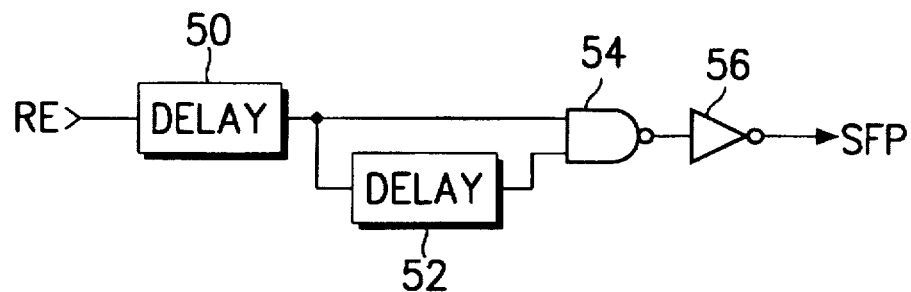
FIG. 8 is a detailed circuit diagram showing a flag pulse generator according to the present invention.
Figure 9:
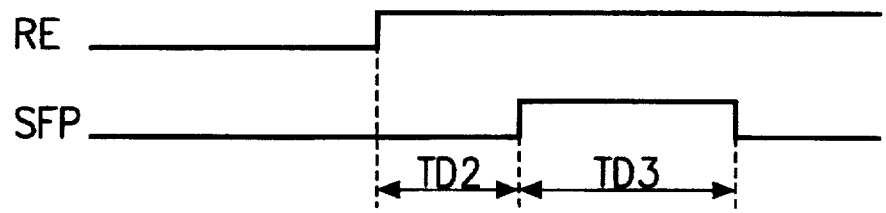
FIG. 9 is a timing diagram showing the operation of FIG. 8.

FIG. 8 is a detailed circuit diagram showing a flag pulse generator according to the present invention. This circuit is composed of two series-connected delay circuits 50 and 52 for delaying the repair enable signal RE, a NAND gate 54 for NANDing the outputs of the delay circuits 50 and 52 and an invertor 56 which is connected to the output of the NAND gate 54 and outputs the flag pulse SFP. If the high repair enable signal RE as shown in FIGS. 5 and 9 is input to the flag pulse generator, the NAND gate 54 generates the logic "low" signal for a time period corresponding to the delay time TD3 of the delay circuit 52. The output of the NAND gate 54 is inverted through the invertor 56 and thus is generated as the flag pulse SFP which stays at the logic "high" level for the delay time TD3 as shown in FIGS. 5 and 9. This flag pulse SFP is shifted by the shift register and is used as the signal for selecting one of the spare row circuits. It should be noted that the delay time TD2 of the delay circuit 50 is set to be longer than the delay time TD1 of the delay circuit 44 so that the flag pulse SFP can be generated sufficiently after the reset pulse SRP is generated.

Figure 10:
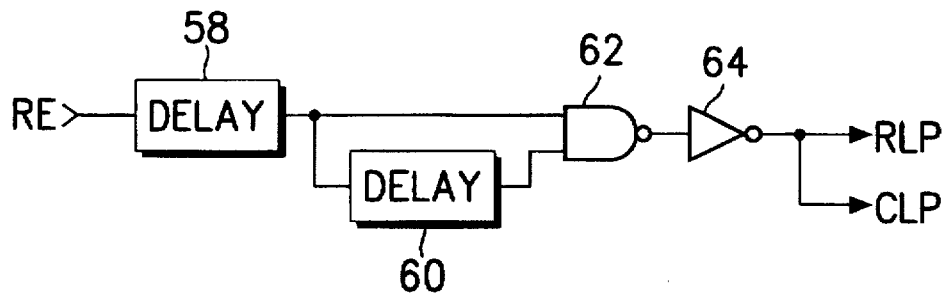
FIG. 10 is a detailed circuit diagram showing a latch pulse generator according to the present invention.

FIG. 10 is a detailed circuit diagram showing a latch pulse generator according to the present invention. It has the same construction as the flag pulse generator of FIG. 8, except that the delay time TD4 of the delay circuit 58 is set to be longer than the delay time TD2 of the delay circuit 50. Thus, the row latch pulse RLP or the column latch pulse CLP is generated sufficiently after the flag pulse SFP is generated.

Figure 15:
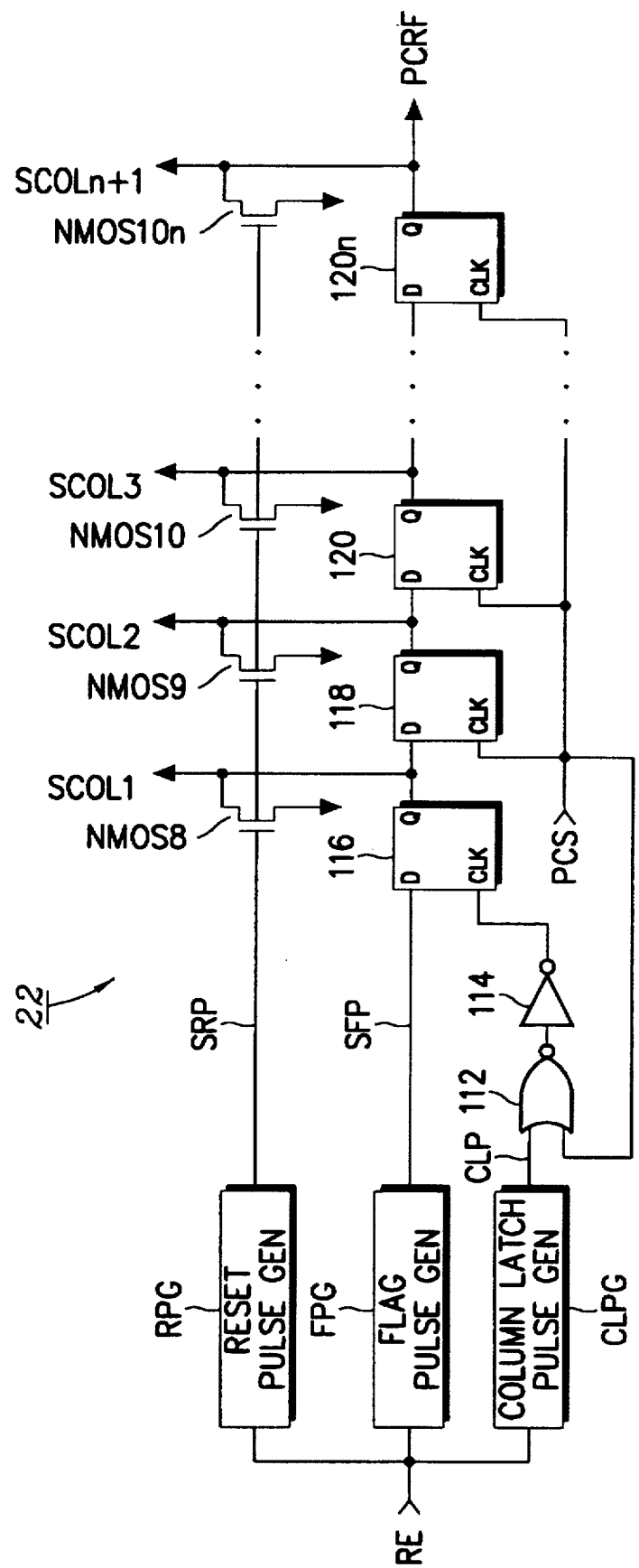
FIG. 15 is a detailed circuit diagram showing a spare column selector according to the present invention.

The pulse generators as shown in FIGS. 7, 8 and 10 operate in response to the repair enable signal RE and will be used in the spare column selector of FIG. 15.

Figure 11:
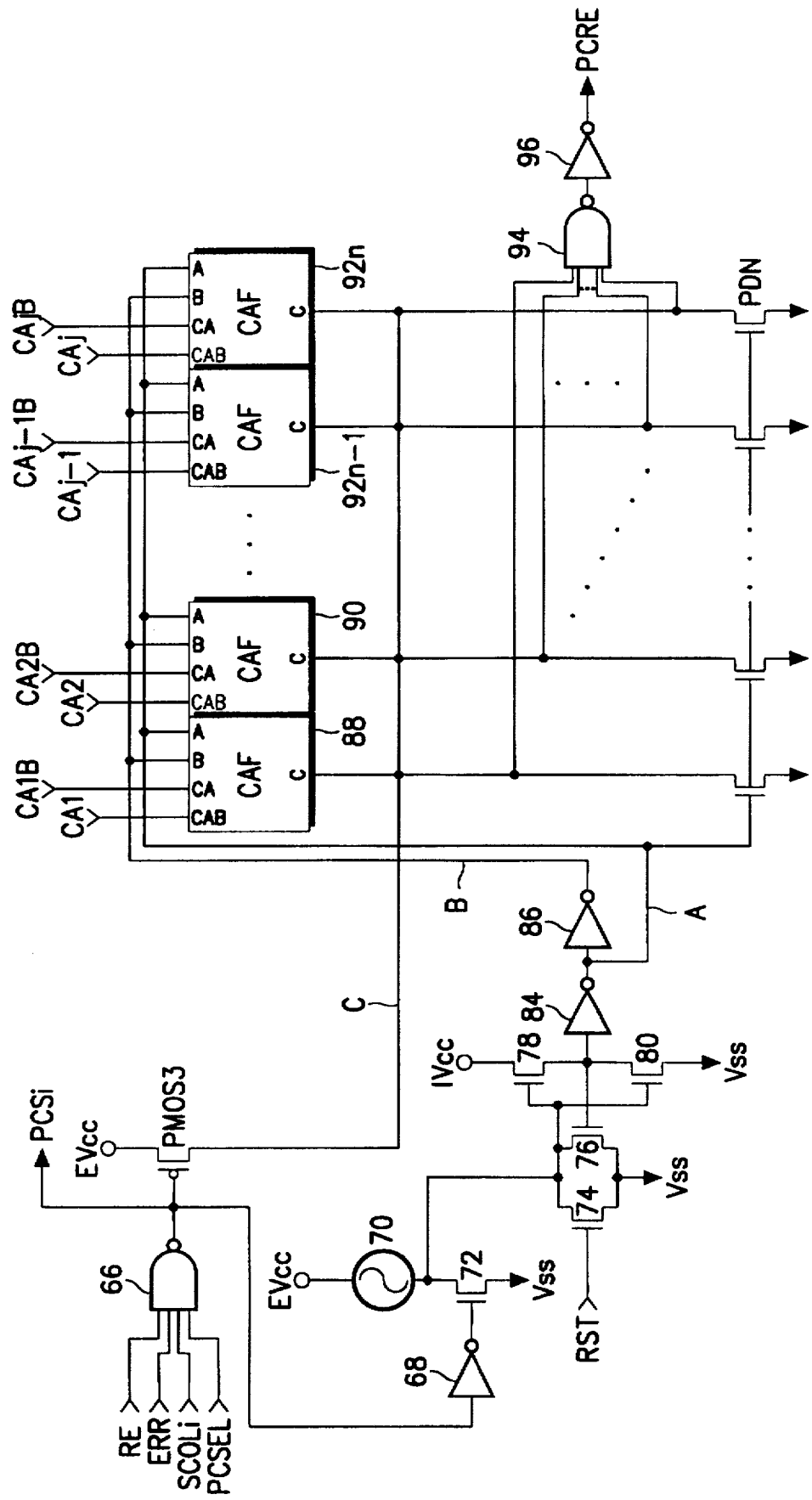
FIG. 11 is a circuit diagram showing a spare column circuit according to the present invention.

FIG. 11 is a circuit diagram showing a spare column circuit according to the present invention, and which can perform a column repair for a failed memory cell simultaneously with the wafer test by using the electrical fuses. This circuit has a plurality of column address fuse circuits (hereinafter referred to as a "CAF") 88–92n. Each of the column address fuse circuits has electrical fuses which are opened by the program voltage supplied from the column address program voltage supply unit. The column address program voltage supply unit is composed of a NAND gate 66 which NANDs the repair enable signal RE, the error pulse ERR, the spare column selection signal SCOLi and the spare column mode selection signal PCSEL, and thereby activates the spare column shift clock PCSi. A third PMOS transistor PMOS3 supplies the external power supply voltage EVcc, i.e. the program voltage to the CAFs 88–92n, in response to the spare column shift clock PCSi. The construction of the column redundancy circuit, except that the fuses in the CAFs 88–92n are automatically cut off by the operation of the column address program voltage supply unit, is disclosed in U.S. Pat. No. 4,829,480 assigned to Samsung Electronics Co., Ltd., the disclosure of which is hereby incorporated herein by reference.

Figure 12:
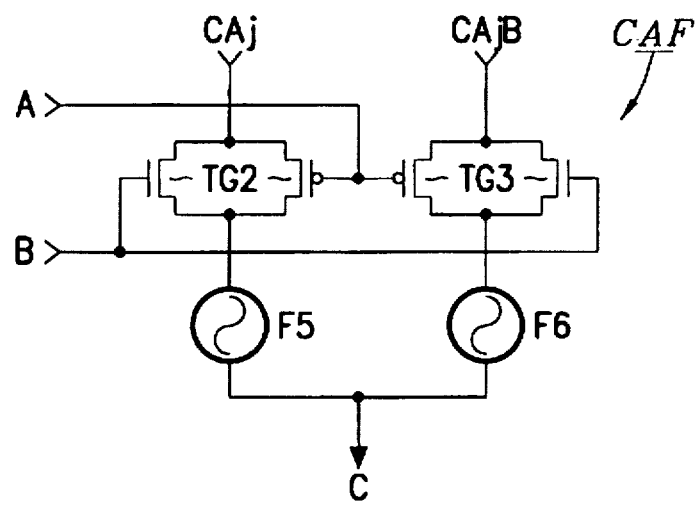
FIG. 12 is a detailed circuit diagram showing a column address fuse circuit shown in FIG. 11.

FIG. 12 is a detailed circuit diagram showing the column address fuse circuit of FIG. 11. This circuit is composed of fuses F5 and F6 which are commonly connected to a node C at their one ends and which correspond to the decoded column address CAj and CAjB (j=1,2,... j), and second and third transfer gates TG2 and TG3 which are connected to the other ends of the fuses F5 and F6 and input the decoded column address CAj and CAjB, respectively. The NMOS transistors of the second and third transfer gates TG2 and TG3 are commonly connected to an internal node B of FIG. 11 and the PMOS transistors thereof to a node A.

Figure 13:
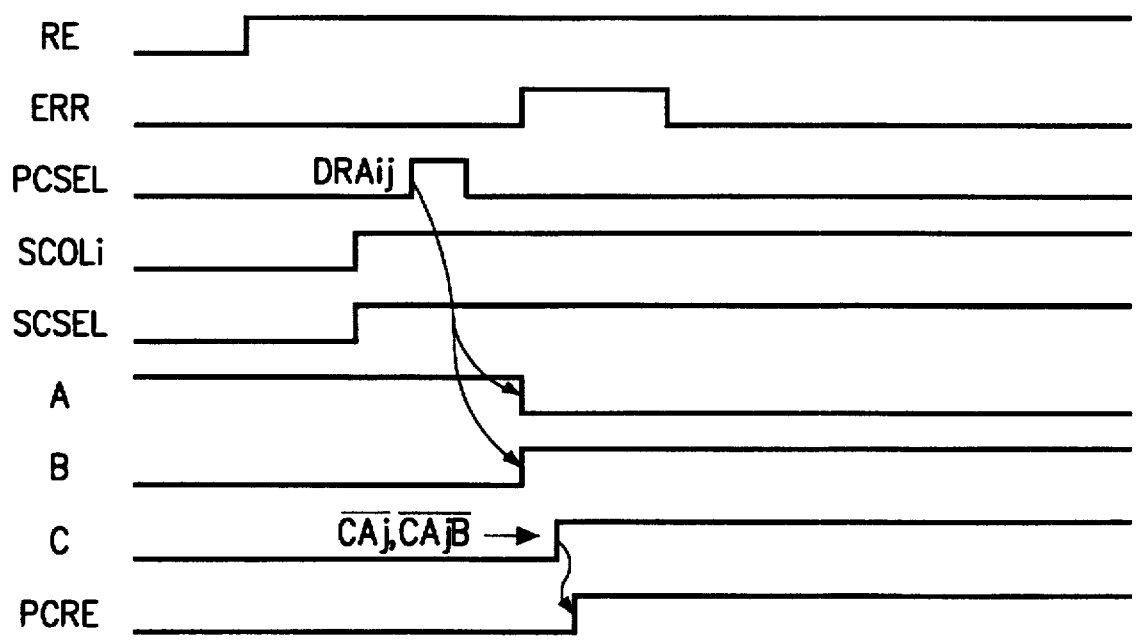
FIG. 13 is a timing diagram showing the operation of FIG. 11.

FIG. 13 is a timing diagram showing the operation of FIG. 11. The operation of the spare column circuit will be discussed with reference to FIGS. 11–13.

If the repair enable signal RE, the error pulse ERR, the spare column selection signal SCOLi and the spare column mode selection signal PCSEL are all at the logic "high" levels, the output of the NAND gate 66 is activated to the logic "low" level. This logic "low" signal is the column repair shift clock PCSi and is supplied to the gate of the third PMOS transistor PMOS3 and to the input node of an invertor 68. Thus, the third PMOS transistor PMOS3 is turned on and then supplies the fuse program voltage, i.e. the external power supply voltage EVcc, to the node C which is commonly connected to the CAFs 88–92n.

At this time, the logic "high" signal output from the invertor 68 is applied to the gate of an NMOS transistor 72.

Hence, if the detection information on the failed memory cell is output from the test device 12 in the state when the repair mode selector 18 activates the spare column mode selection signal PCSEL to the logic "high" level by the error pulse ERR output from the test device 12, the NMOS transistor 72 is turned on. With the turn-on of the NMOS transistor 72, the electrical fuse connected to the drain of the NMOS transistor 72, i.e. the main fuse 70, is opened by the high current of the external power supply voltage EVcc. The main fuse 70 has the same construction as FIG. 3. If the main fuse 70 is cut off, the internal node B goes to the logic "high" level and the internal node A goes to the logic "low" level as shown in FIG. 13, thereby turning on the transfer gates TG2 and TG3 of the CAFs 88–92n.

In this state, if the decoded column address signals CA1, CA1B, . . . CAj, CAjB of the failed memory cell are input, the fuses corresponding to the failed column address of the fuses F5 and F6 in the CAFs 88–92n are opened. For example, if the column address signals CA1, CA2, . . . CAj are failed column addresses, their complementary address signals CA1B, CA2B, . . . CAjB are input as the logic "low" levels. Thus, the high current of the external power supply voltage EVcc at the node C is supplied to the low column address signals via the fuses F6 and the transfer gates TG3, thereby opening the fuses F6 in the CAFs 88–92n. With the above operation, the fuses corresponding to the failed column addresses are automatically opened, and thus the failed address is programmed simultaneously with the memory cell test for checking whether or not the memory cell is defective.

During the test, if the logic "high" level of the column address signals CA1, CA1B, . . . CAj, CAjB is the internal power supply voltage IVcc level, current flows from the internal node C to the input terminals to which the decoded column address signals CA1, CA1B, . . . CAj, CAjB are input, due to the voltage difference between the external power supply voltage EVcc which is applied to the internal node C and the internal power supply voltage IVcc. Therefore, during the test and repair operations, the logic "high" level of the column address signals CA1, CA1B, . . . . CAj, CAjB should be as high as the external power supply voltage EVcc level.

Figure 14:
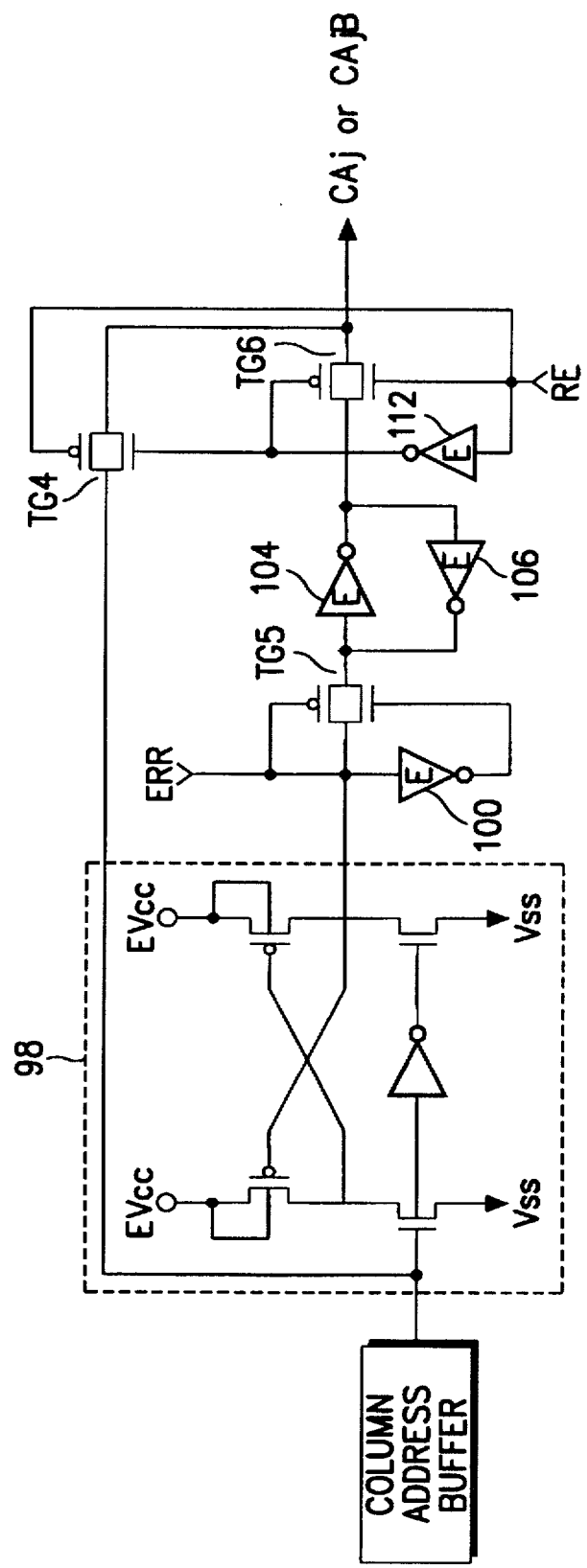
FIG. 14 is a detailed circuit diagram showing a repair column address generator according to the present invention.

FIG. 14 is a detailed circuit diagram showing a repair column address generator according to the present invention. Referring to FIG. 14, a column address buffer is connected to two paths. During a normal active operation, that is, when the repair enable signal RE is at the logic "low" level, the column address signal CAj or CAjB output from the column address buffer is supplied to the transfer gates TG2 and TG3 in the CAFs 88–92n of FIGS. 11 and 12 via a transfer gate TG4. During the repair mode, i.e. when the repair enable signal RE is at the logic "high" level, the column address signal CAj or CAjB which has been changed from the internal power supply voltage IVcc level to the external power supply voltage EVcc level by a level shifter 98, is applied to a transfer gate TG5. Then, the transfer gate TG5 transfers the column address signal CAj or CAjB to a latch circuit composed of two inverters 104 and 106 in response to the error pulse ERR output from the test device 12. This prevents the input of invalid address.

The latch circuit latches the input column address and then outputs an inverted column address to a transfer gate TG6. The transfer gate TG6 supplies the input signal to the CAFs 88–92n when the repair enable signal RE is at an activation state of logic "high" level. Thus, by the circuits shown in FIGS. 12 and 14, the spare column circuits 16a–16n can latch the column address signal CAj or CAjB when the error pulse ERR is generated from the test device 12 as shown in FIG. 13, and open the fuses corresponding to the failed column address, thereby fuse-programming the column address of the failed memory cell. In FIG. 14, the inverters 100, 104, 106 and 112 use the external power supply voltage EVcc as their operating voltages.

If the chip is activated in the state when the column address of the failed memory cell is programmed by the above operation, the repair enable signal RE stays at the logic "low" level and thus the NAND gate 66 outputs the logic "high" signal, turning off the third PMOS transistor PMOS3. The gate of the NMOS transistor 72 connected to the output node of the invertor 68 goes to the logic "low" level, maintaining the turn-off state. In this case, if the main fuse 70 is not cut off, the drain of the NMOS transistor 72 maintains the logic "high" level by the main fuse 70, and the nodes A and B stay at the logic "high" and "low" levels, respectively. Thereby, the pull-down transistors PDN having their drains connected to the NAND gate 94 are turned on, and thus the output of the NAND gate 94 becomes the logic "high" level. Then, the invertor 96 outputs the spare column redundancy enable signal PCRE of logic "low" level. Since this signal for activating the spare column selection line stays at the logic "low" level, the spare column is not enabled.

However, if the main fuse 70 is cut off and the fuses F5 or F6 within the CAFs 88–92n which corresponds to the fail column address are cut off, the drain of the NMOS transistor 72 transitions to the logic "low" state by the "high" reset signal RESET which is activated by the information of the decoded row address DRAi, DRAj. Thereby, the internal node B goes to the logic "high" level and the internal node A goes to the logic "low" level, transferring the column address signals CAj and CAjB to the NAND gate 94. That is, if all inputs of the NAND gate 94 are at the logic "high" levels, i.e. if the column address which has been programmed corresponds to the input column address signal, the spare column redundancy enable signal PCRE goes to the logic "high" level, enabling the spare column selection line and disabling the normal column selection line.

When there are a plurality of spare column circuits as shown in FIG. 1, if the failed memory cell is detected, only one of the spare column circuits is selected and the fuses within the selected spare column circuit are programmed, thereby programming the failed address. At this time, if the error pulse ERR goes to the logic "high" level, the fuses connected to the drains of the NMOS transistors which receive at their gates the predecoded row addresses corresponding to the failed memory cell are opened, and another spare column circuit is selected before testing the following memory cell. Further, the spare column circuit which has been selected and used for repairing should not be selected again until the test is completed. Such a selection is performed by the operation of the spare column selector 22 in FIG. 1.

Figure 16:
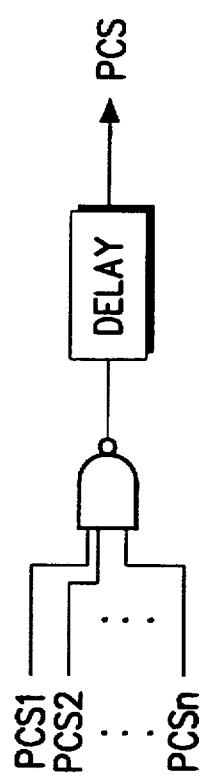
FIG. 16 is a detailed circuit diagram showing a shift clock generator shown in FIG. 15.

FIG. 15 is a detailed circuit diagram showing a spare column selector according to the present invention, for selecting one of the spare column circuits. The construction and operation of the spare column selector are similar to those of FIG. 4. In FIG. 15, a column latch pulse generator CLPG has the same construction as FIG. 10. The PCS is the repair column shift clock and is generated by logic-operating the clocks PCSi output from the NAND gate 66 of FIG. 11 as shown in FIG. 16.

Figure 17:
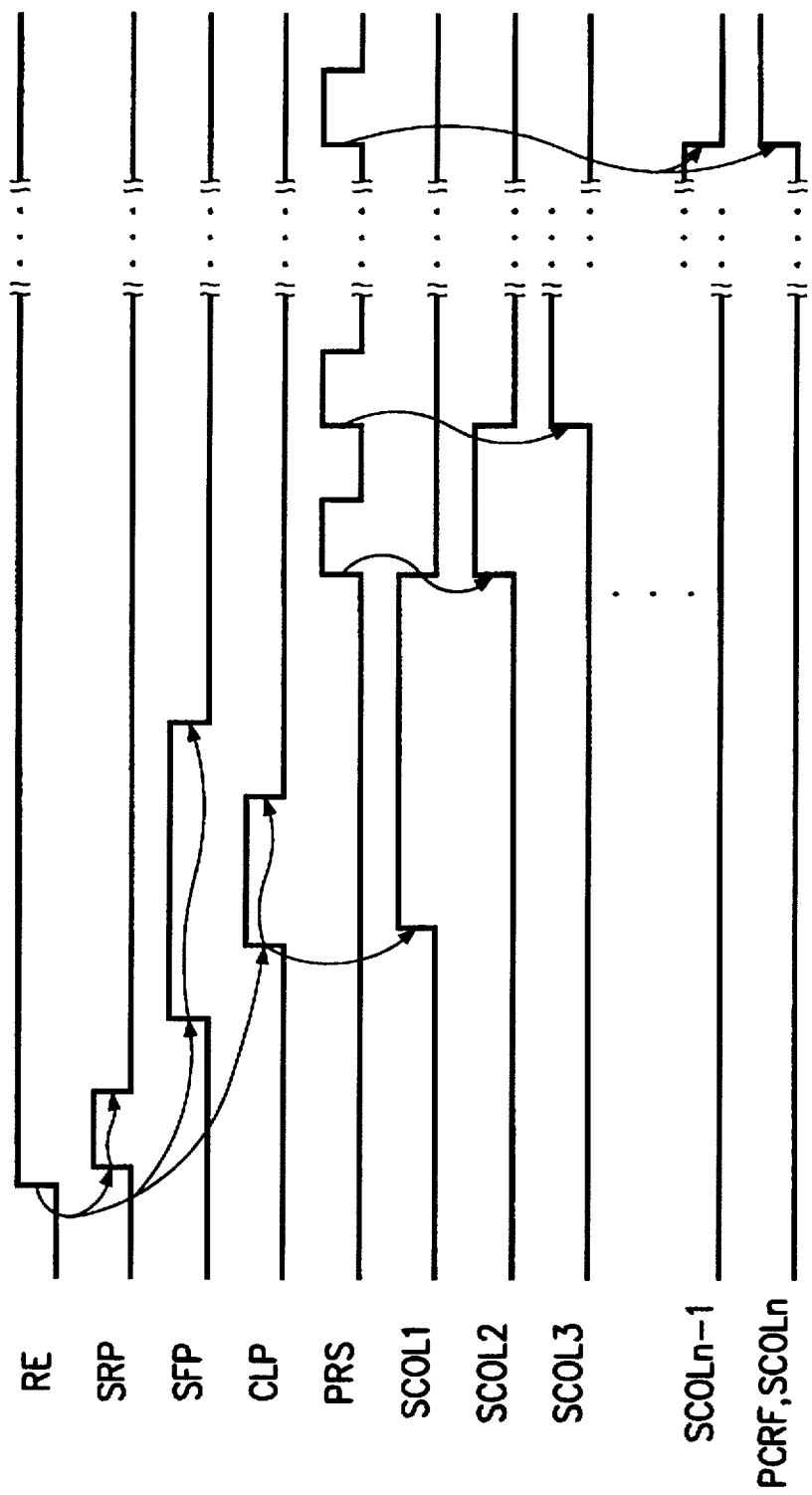
FIG. 17 is a timing diagram showing the operation of FIG. 15.

FIG. 17 is a timing diagram showing the operation of FIG. 15. The operation may be understood with reference to FIGS. 4 and 17. The spare column selector resets the spare column selection signals SCOLi to the logic "low" levels by the selected reset pulse SRP. The selected flag pulse SFP activates the spare column selection signal SCOLL by the column latch pulse signal CLP and then the spare column selection signal SCOLi is shifted one by one by the repair column shift clock PCS. If the final spare column selection signal SCOLn goes to the logic "high" level, the column repair failure signal PCRF is activated by the latch circuit (not shown) and then is supplied to the NAND gate 24 of FIG. 1.

If the test for all memory cells is not completed until the column repair failure signal PCRF and row repair failure signal PRRF all go to the logic "high" levels, the NAND gate 24 outputs the repair failure signal RF to the test device 12. This informs the device that there are no more spare word lines or spare column selection lines to be replaced.

The present invention includes a repair mode selector 18 for immediately determining whether to replace the fail memory cell by the spare word line or by the spare column selection line. This repair mode selector 18 preferentially repairs the row line, i.e. the word line. However, if two bits fail in one column, it operates to replace the failed bits by the spare columns.

Figure 18:
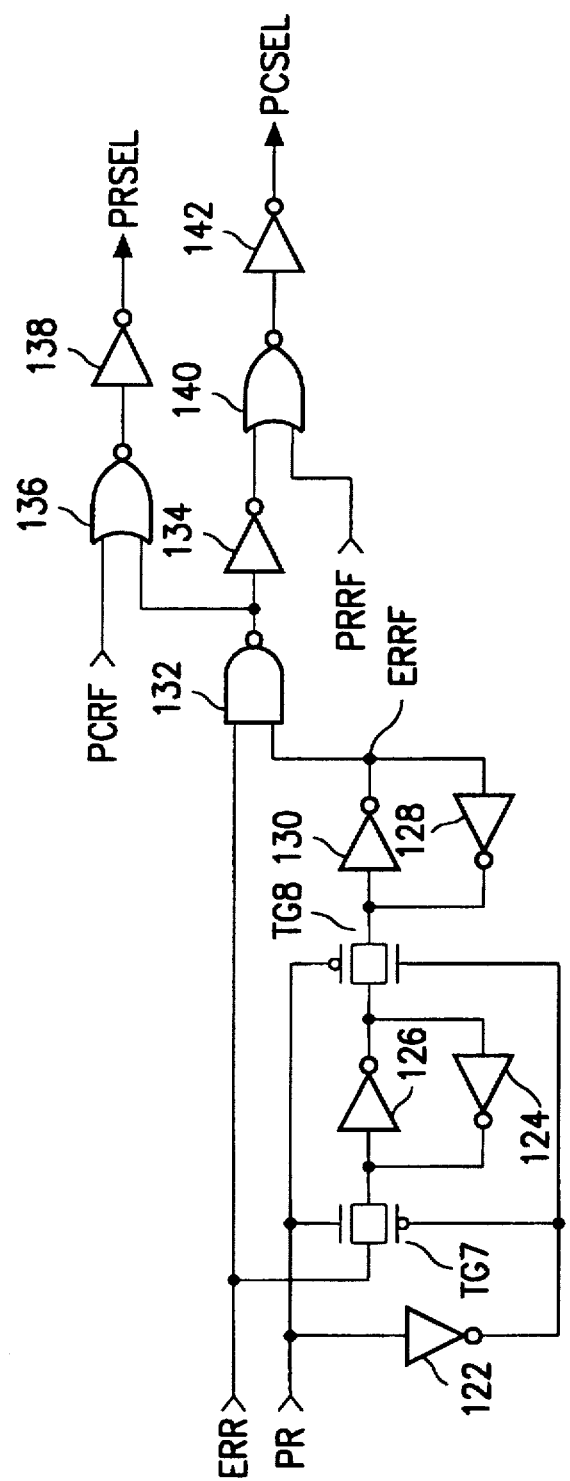
FIG. 18 is a detailed circuit diagram showing a repair mode selector according to the present invention.

FIG. 18 is a detailed circuit diagram showing a preferred embodiment of the repair mode selector according to the present invention. This circuit has a shift register which latches and shifts the error pulse ERR output from the test device 12 by the clock PR generated in synchronization with the row address strobe signal $\overline{RAS}$ and generates a shifted error pulse ERRF. A detector compares the error pulse ERR with the shifted error pulse ERRF and detects continuity of a failed column address. A mode selection signal generator logically combines the output of the detector, the spare column repair failure signal PCRF and the spare row repair failure signal PRRF, and then selectively outputs the spare row mode selection signal PRSEL and the spare column mode selection signal PCSEL. In FIG. 18, the shift register is comprised of an invertor 122, transfer gates TG7 and TG8, a latch composed of inverters 124 and 126 and a latch composed of inverters 128 and 130. The detector corresponds to a NAND gate 132. The mode selection signal generator is comprised of NOR gates 136 and 140 and inverters 134, 138 and 142.

Figure 19:
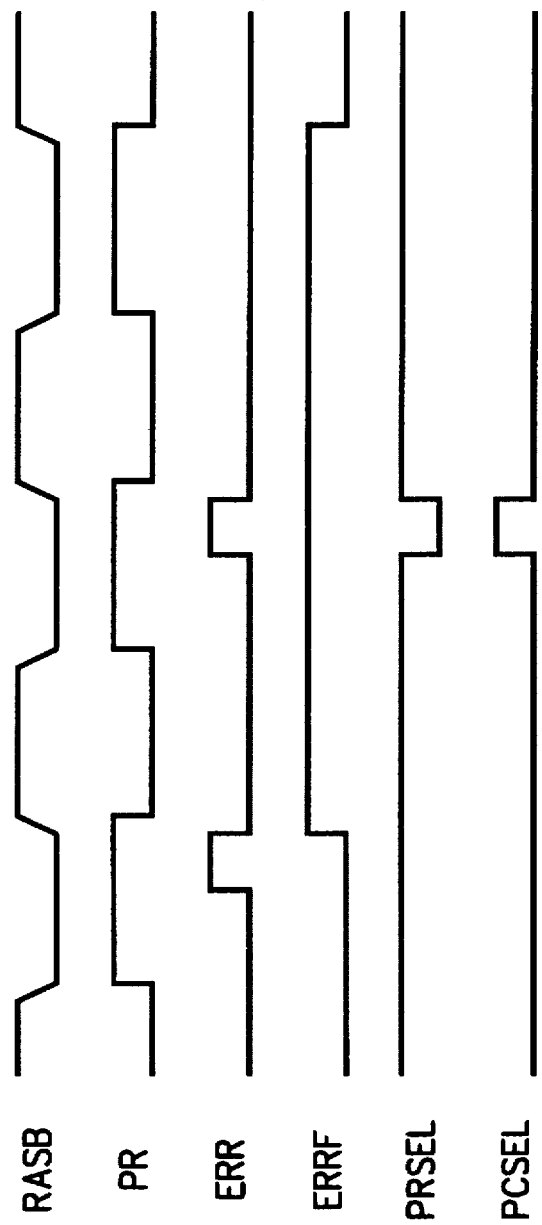
FIG. 19 is a timing diagram showing the operation of the repair mode selector of FIG. 18.

FIG. 19 is a timing diagram showing the operation of FIG. 18. If the error pulse ERR is generated from the test device 12, it is stored at the latch composed of the inverters 124 and 126 by the clock PR synchronized with the row address strobe signal RASB as shown in FIG. 19. If the error pulse ERR is continuously generated by the continuous occurrence of the failed memory cells, the error pulse ERR stored at the latch composed of the inverters 124 and 126 is shifted to the other latch composed of the inverters 128 and 130 via the transfer gate TG8, and then stored as the ERRF of FIG. 18. The NAND gate 132 connected to the output node of the latch, composed of the inverters 128 and 130, outputs the logic "low" signal, thereby activating the spare column mode selection signal PCSEL to the logic "high" level. That is, if two bits sequentially fail in the column direction, the failed bits are replaced by the spare column selection line. If two bits do not sequentially fail in the column direction, the failed bits are replaced by the spare row (word) line. In the present invention, since the test is preferably performed in the column direction, the test pattern during the repair mode is the march pattern.

The repair mode selector 18 as described above preferentially repairs the failures of the row memory cells.

However, if all spare word lines are used, i.e. when the row repair failure signal PRRF goes to the logic "high" level, the column repair operation is performed. That is, the repair is performed by the spare column selection line. If the repair row failure signal PRRF is at the logic "high" level, this means that there is no selected spare row circuit. Thus, it is of no concern whether the spare row mode selection signal PRSEL is at the logic "high" level or at the logic "low" level. In contrast, if all spare column circuits are used, i.e. when the column repair failure signal PCRF is at the logic "high" level, the spare row mode selection signal PRSEL maintains the logic "high" state. Thus, the row repair operation continues even in the case of column fail address. Hence, the repair row or repair column mode is automatically performed by the row or column state of the memory cell detected by the test.

As described above, the present invention can electrically and automatically program the fuse within the spare row circuit or spare column circuit according to a failed memory cell which is detected during a burn-in test after packaging, and thus immediately repair the failed memory cell by a spare row or spare column of the spare memory cell. This enables a high speed redundancy operation, thus enhancing the yield. Further, automatic selection of the repair mode increases the efficiency of the redundancy.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device, comprising:
   a plurality of normal memory cells;
   a plurality of spare memory cells;
   a plurality of spare substituting circuits, each of which is responsive to a defective normal memory cell address which is programmed therein, and which substitutes at least one spare memory cell for at least one defective normal memory cell which is located at the defective normal memory cell address which is programmed therein; and
   sequential spare substituting circuit selecting means, connected to said plurality of spare substituting circuits and responsive to a defect indication signal from external to said integrated circuit memory device, for sequentially selecting a respective one of said spare circuits for programming with sequential ones of defective normal memory cell addresses.

2. An integrated circuit memory device according to claim 1 wherein said sequential spare substituting circuit selecting means further comprises:
   means for generating an alarm signal in response to a last one of said plurality of spare substituting circuits being sequentially selected.

3. An integrated circuit memory device according to claim 1:
   wherein said plurality of normal memory cells are arranged in an array having a plurality of normal memory cell rows and a plurality of normal memory cell columns;
   wherein said plurality of spare memory cells comprise a plurality of spare memory cell rows and a plurality of spare memory cell columns;
   wherein said plurality of spare substituting circuits comprise a plurality of row substituting circuits each of which is responsive to a defective normal memory cell row address which is programmed therein, and which substitutes a spare memory cell row for a normal memory cell row including a defective memory cell which is located at the defective normal memory cell row address which is programmed therein, and a plurality of column substituting circuits each of which is responsive to a defective normal memory cell column address which is programmed therein, and which substitutes a spare memory cell column for a normal memory cell column including a defective memory cell which is located at the defective normal memory cell column address which is programmed therein; and wherein said sequential spare substituting circuit selecting means comprises sequential spare row selecting means for sequentially selecting a respective one of said row substituting circuits for programming with sequential ones of defective normal memory cell row addresses, and sequential spare column selecting means for sequentially selecting a respective one of said column substituting circuits for programming with sequential ones of defective normal memory cell column addresses.

4. An integrated circuit memory device according to claim 3 wherein said sequential spare substituting circuit selecting means further comprises:

means, responsive to said defect indicating signal indicating a defect in at least two normal memory cells in different rows and a same column, for activating a sequential spare column selecting means for programming with the address of the same column.

5. An integrated circuit memory device according to claim 1 in combination with:

a memory device tester, which is external to said memory device, and which sequentially tests memory cells at selected memory cell addresses, and which provides the defect indicating signal to said sequential spare substituting circuit selecting means upon detecting a defective memory cell at the selected memory cell address.

6. An integrated circuit memory device according to claim 3 wherein said sequential spare substituting circuit selecting means further comprises:

means, responsive to an indication that a last one of said plurality of row substituting circuits has been programmed, for sequentially selecting a respective one of said column substituting circuits.

7. An integrated circuit memory device according to claim 1 wherein each of said spare substituting circuits comprises:

a plurality of electrically programmable fuses; and means responsive to a defective normal memory cell address which is applied thereto, and to said sequential spare substituting circuit selecting means, for programming said plurality of electrically programmable fuses with said defective normal memory cell address upon selection of said spare substituting circuit by said sequential spare substituting circuit selecting means.

8. An integrated circuit memory device according to claim 7:

wherein said plurality of electrically programmable fuses comprise a plurality of elongated fuses, each having a central portion and a pair of fuse ends which are wider than said central portion; and wherein said programming means comprises current supplying means, for supplying current through the elongated fuses which correspond to said defective normal memory cell address, to thereby open the elongated fuses which correspond to said defective normal memory cell address.

9. An integrated circuit memory device according to claim 8:

wherein said plurality of elongated fuses comprise a plurality of polycrystalline silicon elongated fuses.

10. An integrated circuit memory device, comprising:

a plurality of normal memory cells;

a plurality of spare memory cells;

a plurality of spare substituting circuits, each of which is responsive to a defective normal memory cell address which is programmed therein, and which substitutes at least one spare memory cell for at least one defective normal memory cell which is located at the defective normal memory cell address which is programmed therein; and spare substituting circuit selecting means, connected to said plurality of spare substituting circuits and which is responsive to a defect indication signal from external to said integrated circuit memory device, for selecting one of said spare circuits for programming with a defective normal memory cell addresses;

wherein each of said spare substituting circuits comprises:

a plurality of electrically programmable fuses; and means responsive to a defective normal memory cell address which is applied thereto, and to said spare substituting circuit, for programming said plurality of electrically programmable fuses with said defective normal memory cell address upon selection of said spare substituting circuit by said spare substituting circuit selecting means.

11. An integrated circuit memory device according to claim 10 wherein said spare substituting circuit selecting means further comprises:

means for generating an alarm signal in response to a last one each of said plurality of spare substituting circuits being selected.

12. An integrated circuit memory device according to claim 10:

wherein said plurality of normal memory cells are arranged in an array having a plurality of normal memory cell rows and a plurality of normal memory cell columns;

wherein said plurality of spare memory cells comprise a plurality of spare memory cell rows and a plurality of spare memory cell columns;

wherein said plurality of spare substituting circuits comprise a plurality of row substituting circuits each of which is responsive to a defective normal memory cell row address which is programmed therein, and which substitutes a spare memory cell row for a normal memory cell row including a defective memory cell which is located at the defective normal memory cell row address which is programmed therein, and a plurality of column substituting circuits each of which is responsive to a defective normal memory cell column address which is programmed therein, and which substitutes a spare memory cell column for a normal memory cell column including a defective memory cell which is located at the defective normal memory cell column address which is programmed therein; and wherein said spare substituting circuit selecting means comprises spare row selecting means for selecting one of said row substituting circuits for programming with a defective normal memory cell row address, and spare column selecting means for selecting one of said column substituting circuits for programming with a defective normal memory cell column address.

13. An integrated circuit memory device according to claim 12 wherein said spare substituting circuit selecting means further comprises:

means, responsive to said defect indicating signal indicating a defect in at least two normal memory cells in different rows and a same column, for activating a spare column selecting means for programming with the address of the same column.

14. An integrated circuit memory device according to claim 10 in combination with:

a memory device tester, which is external to said memory device, and which sequentially tests memory cells at selected memory cell addresses, and which provides the defect indicating signal to said spare substituting circuit selecting means upon detecting a defective memory cell at the selected memory cell address.

15. An integrated circuit memory device according to claim 12 wherein said spare substituting circuit selecting means further comprises:

means, responsive to an indication that a last ones of said plurality of row substituting circuits has been programmed, for selecting a respective one of said column substituting circuits.

16. An integrated circuit memory device according to claim 10:

wherein said plurality of electrically programmable fuses comprise a plurality of elongated fuses, each having a central portion and a pair of fuse ends which are wider than said central portion; and wherein said programming means comprises current supplying means, for supplying current through the elongated fuses which correspond to said defective normal memory cell address, to thereby open the elongated fuses which correspond to said defective normal memory cell address.

17. An integrated circuit memory device according to claim 16:

wherein said plurality of elongated fuses comprise a plurality of polycrystalline silicon elongated fuses.

18. An integrated circuit memory device, comprising:

a plurality of normal memory cells;

a plurality of spare memory cells;

a plurality of spare substituting circuits, each of which is responsive to a defective normal memory cell address which is programmed therein, and which substitutes at least one spare memory cell for at least one defective normal memory cell which is located at the defective normal memory cell address which is programmed therein; and spare substituting circuit selecting means, connected to said plurality of spare substituting circuits and which is responsive to a defect indication signal from external to said integrated circuit memory device, for selecting one of said spare circuits for programming with a defective normal memory cell addresses; and for transmitting an alarm signal to external of said integrated circuit device in response to each of said plurality of spare substituting circuits being selected.

19. An integrated circuit memory device according to claim 18:

wherein said plurality of normal memory cells are arranged in an array having a plurality of normal memory cell rows and a plurality of normal memory cell columns;

wherein said plurality of spare memory cells comprise a plurality of spare memory cell rows and a plurality of spare memory cell columns;

wherein said plurality of spare substituting circuits comprise a plurality of row substituting circuits each of which is responsive to a defective normal memory cell row address which is programmed therein, and which substitutes a spare memory cell row for a normal memory cell row including a defective memory cell which is located at the defective normal memory cell row address which is programmed therein, and a plurality of column substituting circuits each of which is responsive to a defective normal memory cell column address which is programmed therein, and which substitutes a spare memory cell column for a normal memory cell column including a defective memory cell which is located at the defective normal memory cell column address which is programmed therein; and wherein said spare substituting circuit selecting means comprises spare row selecting means for selecting one of said row substituting circuits for programming with a defective normal memory cell row address, and spare column selecting means for selecting one of said column substituting circuits for programming with a defective normal memory cell column address.

20. An integrated circuit memory device according to claim 19 wherein said spare substituting circuit selecting means further comprises:

means, responsive to said defect indicating signal indicating a defect in at least two normal memory cells in different rows and a same column, for activating a spare column selecting means for programming with the address of the same column.

21. An integrated circuit memory device according to claim 18 in combination with:

a memory device tester, which is external to said memory device, and which sequentially tests memory cells at selected memory cell addresses, and which provides the defect indicating signal to said spare substituting circuit selecting means upon detecting a defective memory cell at the selected memory cell address.

22. An integrated circuit memory device according to claim 18 wherein said spare substituting circuit selecting means further comprises:

means, responsive to an indication that a last one of said plurality of row substituting circuits has been programmed, for selecting a respective one of said column substituting circuits.

23. An integrated circuit memory device, comprising:

a plurality of normal memory cells arranged in an array having a plurality of normal memory cell rows and a plurality of normal memory cell columns;

a plurality of spare memory cell rows;

a plurality of spare memory cell columns;

a plurality of row substituting circuits each of which is responsive to a defective normal memory cell row address which is programmed therein, and which substitutes a spare memory cell row for a normal memory cell row including a defective memory cell which is located at the defective normal memory cell row address which is programmed therein;

a plurality of column substituting circuits each of which is responsive to a defective normal memory cell column address which is programmed therein, and which substitutes a spare memory cell column for a normal memory cell column including a defective memory cell which is located at the defective normal memory cell column address which is programmed therein;

spare row selecting means for selecting one of said row substituting circuits for programming with a defective normal memory cell row address;

spare column selecting means for selecting one of said column substituting circuits for programming with a defective normal memory cell column address; and means, responsive to defect indicating signals from external to said memory device, and which indicate a defect in two normal memory cells in different rows and a same column, for activating a spare column selecting means for programming with the address of the same column.

24. An integrated circuit memory device according to claim 23 further comprising:

means for generating an alarm signal in response to a last one of said plurality of row and column substituting circuits being selected.

25. An integrated circuit memory device according to claim 23 further comprising:

means, responsive to an indication that a last ones of said plurality of row substituting circuits has been programmed, for selecting one of said column substituting circuits.

26. A method for repairing integrated circuit memory devices, including a plurality of normal memory cells and a plurality of spare memory cells, using a memory testing system which is external to the integrated circuit memory devices, said method comprising the steps of:

sequentially addressing said normal memory cells by said memory testing system;

sequentially failure testing the addressed normal memory cells by said memory testing system;

providing from said memory testing system to said memory device, a defect indicating signal to indicate that a normal memory cell which is being addressed and failure tested is defective; and wherein said memory device performs the step of automatically programming a plurality of fuses in the memory device with the address of the defective normal memory cell in response to the defect indicating signal, to thereby substitute at least one spare memory cell for at least one defective normal memory cell which is located at the defective normal memory cell address.

27. A method according to claim 26 wherein said automatically programming step is followed by the following step which is performed by said memory devices:

selecting a second plurality of fuses for programming with a second address of a defective normal memory cell in response to a second defect indicating signal from said memory testing system, to thereby substitute at least one second spare memory cell for at least one second defective normal memory cell which is located at the second defective normal memory cell address.

28. A method according to claim 27 wherein said step of selecting a second plurality of fuses is followed by the step of:

generating an alarm signal if the second plurality of fuses is already programmed.

29. A method according to claim 26 wherein said plurality of normal memory cells are arranged in an array having a plurality of normal memory cell rows and a plurality of normal memory cell columns, wherein said plurality of spare memory cells comprise a plurality of spare memory cell rows and a plurality of spare memory cell columns, and wherein said step of automatically programming a plurality of fuses comprises the step of:

automatically programming a plurality of fuses in the memory device with the column address of the defective normal memory cell in response to the defect indicating signal, if all of said plurality of spare memory cell rows have been substituted for defective normal memory cell rows, to thereby substitute a spare memory cell column for a defective normal memory cell column.

30. A method according to claim 26 wherein said plurality of normal memory cells are arranged in an array having a plurality of normal memory cell rows and a plurality of normal memory cell columns, wherein said plurality of spare memory cells comprise a plurality of spare memory cell rows and a plurality of spare memory cell columns, and wherein said step of automatically programming a plurality of fuses comprises the step of:

automatically programming a plurality of fuses in the memory device with the column address of the defective normal memory cell in response to the defect indicating signal, if two different rows of normal memory cells include a defective memory cell in a same column, to thereby substitute a spare memory cell column for the at least two different rows of normal memory cells including a defective memory cell in a same column.

31. A method according to claim 26 wherein said step of automatically programming comprises the step of:

automatically applying current to the plurality of fuses in the memory device to thereby open the fuses which correspond to the address of the defective normal memory cell in response to the defect indicating signal, to thereby substitute at least one spare memory cell for at least one defective normal memory cell which is located at the defective normal memory cell address.

* * * * *